(12) United States Patent
Shioda et al.

(10) Patent No.: US 8,779,437 B2
(45) Date of Patent: Jul. 15, 2014

(54) WAFER, CRYSTAL GROWTH METHOD, AND SEMICONDUCTOR DEVICE

(75) Inventors: Tomonari Shioda, Kanagawa-ken (JP); Naoharu Sugiyama, Kanagawa-ken (JP); Shinya Nunoue, Chiba-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/214,626

(22) Filed: Aug. 22, 2011

(65) Prior Publication Data

US 2012/0223323 A1    Sep. 6, 2012

(30) Foreign Application Priority Data

Mar. 3, 2011    (JP) ................................. 2011-046424

(51) Int. Cl.
*H01L 29/15* (2006.01)
*H01L 29/06* (2006.01)
*H01L 21/20* (2006.01)
*H01L 29/205* (2006.01)

(52) U.S. Cl.
CPC .................................... *H01L 29/205* (2013.01)
USPC ........ 257/76; 257/22; 257/627; 257/E29.004; 257/E33.048; 257/E21.09; 438/478; 438/479

(58) Field of Classification Search
CPC ......... H01L 33/00; H01L 33/20; H01L 33/32; H01L 33/105; H01L 33/007; H01L 33/02; H01L 33/10; H01L 33/0083; H01L 33/382; H01L 29/205; H01I 21/00; H01I 21/02381; H01I 21/0254; H01I 21/02505; H01I 21/02458; H01I 21/20
USPC .............. 257/22, 76, 627, E29.004, E29.072, 257/E21.09, E21.091, E21.23, E33.048, 257/E33.068; 438/478, 479; 977/755
See application file for complete search history.

(56) References Cited

U.S. PATENT DOCUMENTS

2008/0179606 A1* 7/2008 Usuda et al. .................... 257/94
2011/0049681 A1* 3/2011 Vielemeyer ................... 257/627
2011/0101307 A1* 5/2011 Lee et al. ......................... 257/22

FOREIGN PATENT DOCUMENTS

JP    2005-20026    1/2005
JP    2008-34411    2/2008

(Continued)

OTHER PUBLICATIONS

13214626_20130308_Robert_Mat_param_thermal_Expan_semi_subs_MatResSocSymp_vol622-2000.*

(Continued)

*Primary Examiner* — Wensing Kuo
*Assistant Examiner* — Moazzam Hossain
(74) *Attorney, Agent, or Firm* — Oblon, Spivak, McClelland, Maier & Neustadt, L.L.P.

(57) ABSTRACT

According to one embodiment, a wafer includes a substrate, a base layer, a foundation layer, an intermediate layer and a functional unit. The substrate has a major surface. The base layer is provided on the major surface and includes a silicon compound. The foundation layer is provided on the base layer and includes GaN. The intermediate layer is provided on the foundation layer and includes a layer including AlN. The functional unit is provided on the intermediate layer and includes a nitride semiconductor. The foundation layer has a first region on a side of the base layer, and a second region on a side of the intermediate layer. A concentration of silicon atoms in the first region is higher than a concentration of silicon atoms in the second region. The foundation layer has a plurality of voids provided in the first region.

23 Claims, 5 Drawing Sheets

(56) References Cited

FOREIGN PATENT DOCUMENTS

JP 2009-96655 5/2009
JP 2010-153817 7/2010

OTHER PUBLICATIONS

Office Action issued Nov. 15, 2011, in Japanese Patent Application No. 2011-046424 with English translation.
S. Tripathy, et al., "Characterization of GaN layers grown on silicon-on-insulator substrates", Applied Surface Science, vol. 253, 2006, pp. 236-240.
Office Action issued Apr. 23, 2012, in Japanese Patent Application No. 2011-046424 with English translation.
И. Г. Аксяhob et al., "The First Nanotechnology International Forum 2008" [Search date Apr. 17, 2012] Searched in Internet <URL:http://rusnanotech08.rusnanoforum.ru/Section.aspx/Show19307>, 5 pages.
U.S. Appl. No. 13/037,582, filed Mar. 1, 2011, Naoharu Sugiyama, et al.
Office Action issued Oct. 15, 2013 in Japanese Patent Application No. 2012-006495 (with English language translation).

* cited by examiner

WAFER, CRYSTAL GROWTH METHOD, AND SEMICONDUCTOR DEVICE

CROSS-REFERENCE TO RELATED APPLICATIONS

This application is based upon and claims the benefit of priority from the prior Japanese Patent Application No. 2011-46424, filed on Mar. 3, 2011; the entire contents of which are incorporated herein by reference.

FIELD

Embodiments described herein relate generally to a wafer, a crystal growth method, and a semiconductor device.

BACKGROUND

Compound semiconductors are utilized in various fields such as high-speed electron devices represented by a high-frequency device, and optical devices represented by a light emitting/receiving device.

The formation of a compound semiconductor crystal on a silicon substrate good for mass production properties tend to generate easily defects and cracks caused by differences in lattice constants or in thermal expansion coefficients. A technology is needed for producing a high-quality crystal on a silicon substrate.

DETAILED DESCRIPTION

Figure 1:
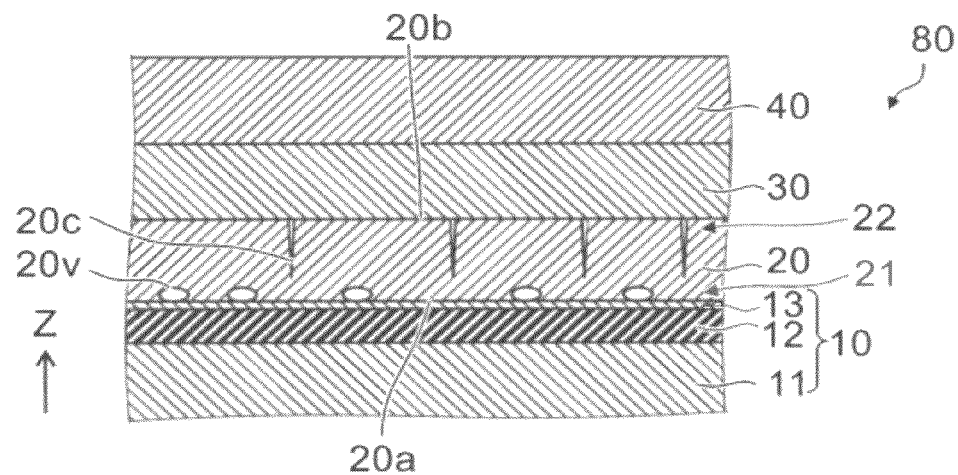
FIG. 1 is a schematic cross-sectional view showing a wafer according to a first embodiment.

In general, according to one embodiment, a wafer includes a substrate, a base layer, a foundation layer, an intermediate layer and a functional unit. The substrate has a major surface. The base layer is provided on the major surface and includes a silicon compound. The foundation layer is provided on the base layer and includes GaN. The intermediate layer is provided on the foundation layer and includes a layer including AlN. The functional unit is provided on the intermediate layer and includes a nitride semiconductor. The foundation layer has a first region on a side of the base layer, and a second region on a side of the intermediate layer. A concentration of silicon atoms in the first region is higher than a concentration of silicon atoms in the second region. The foundation layer has a plurality of voids provided in the first region.

In general, according to another embodiment, a semiconductor device includes a foundation layer, a functional unit and an intermediate layer. The functional unit includes a nitride semiconductor. The intermediate layer is provided between the foundation layer and the functional unit and includes a layer including AlN. The foundation layer has a first region on a side opposite to intermediate layer, and a second region on a side of the intermediate layer. A concentration of silicon atoms in the first region is higher than a concentration of silicon atoms in the second region. A first surface on a side opposite to the intermediate layer of the foundation layer has a plurality of concave portions.

In general, according to another embodiment, a crystal growth method includes forming a foundation layer including GaN on a silicon layer. The silicon layer is provided on a base layer including a silicon compound. The base layer is provided on a major surface of a substrate. The silicon layer has a thickness not less than 1 nanometer and not more than 50 nanometers. The method further includes forming an intermediate layer including a layer including AlN on the foundation layer. The method further includes forming a functional unit including a nitride semiconductor on the intermediate layer.

Various embodiments will be described hereinafter with reference to the accompanying drawings.

The drawings are schematic or conceptual; and the relationships between the thicknesses and widths of portions, the proportions of sizes among portions, etc., are not necessarily the same as the actual values thereof. Further, the dimensions and the proportions may be illustrated differently among the drawings, even for identical portions.

In the specification and the drawings of the application, components similar to those described in regard to a drawing thereinabove are marked with like reference numerals, and a detailed description is omitted as appropriate.

(First Embodiment)

A first embodiment relates to a wafer. For example, at least a part of a semiconductor device, or a part to be at least a part of a semiconductor device is provided in the wafer. The semiconductor device includes, for example, a semiconductor light emitting device, a semiconductor light receiving device, an electronic device and the like. The semiconductor light emitting device includes, for example, a light-emitting diode (LED), a laser diode (LD) and the like. The semiconductor light receiving device includes, for example, a photo diode (PD) and the like. The electronic device includes, for example, a high electron mobility transistor (HEMT), a heterojunction bipolar transistor (HBT), a field effect transistor (FET), a Schottky barrier diode (SBD) and the like.

FIG. 1 is a schematic cross-sectional view illustrating the configuration of the wafer according to the first embodiment.

As shown in FIG. 1, a wafer 80 according to the embodiment includes a substrate 11, a base layer 12, a foundation layer 20, an intermediate layer 30 and a functional unit 40.

As the substrate 11, for example, a silicon substrate is used. As the substrate 11, for example, a single crystalline silicon substrate is used. A major surface of the substrate 11 is, for example, a (111) plane. However, the substrate 11 may not be a substrate of a (111) plane.

The base layer 12 is provided on the major surface of the substrate 11. The base layer 12 includes a silicon compound. The foundation layer 20 is provided on the base layer 12. The foundation layer 20 includes GaN. The intermediate layer 30 is provided on the foundation layer 20. The intermediate layer 30 includes a layer including AlN. The functional unit 40 is provided on the intermediate layer 30. The functional unit 40 includes a nitride semiconductor. In the specification of the application, the layer including AlN includes a layer including $Al_xIn_yGa_zN$ ($0<x\le1$, $0\le y\le1$, $0\le z<1$).

The functional unit 40 has various configurations corresponding to applications of the wafer 80. For example, when the wafer 80 is one for LED, the functional unit 40 includes, for example, an n-type semiconductor layer, a p-type semiconductor layer, and a light emitting layer (active layer) provided between the n-type semiconductor layer and the p-type semiconductor layer. Furthermore, it may be assumed that an n-type semiconductor layer, a light emitting layer and a p-type semiconductor layer are formed on the functional unit 40. Examples of the functional unit 40 will be described later.

In this example, the wafer 80 is further includes a silicon layer 13. The silicon layer 13 is provided between the base layer 12 and the foundation layer 20. The silicon layer 13 has a thickness not less than 1 nanometer (nm) and less than 50 nm. The silicon layer 13 has a (111) plane as the major surface. However, the major surface of the silicon layer 13 may not be exactly a (111) plane. Depending on conditions, for example, a polycrystalline layer oriented in the direction of the (111) plane can be used as the silicon layer 13. The thickness of respective layers included in the wafer 80 can be obtained, for example, by observing the cross-section of the layers with a scanning electron microscope, and the like.

As described later, the silicon layer 13 exists in the middle of manufacturing the wafer 80, but, in some cases, it is lost after the fabrication of the wafer 80. The silicon layer 13 remains partially, in some cases. The silicon layer 13 is not observed, in some cases, in the wafer 80.

Here, an axis along the direction from the foundation layer 20 toward the functional unit 40 is defined as a Z axis. The Z axis is an axis in the stacked direction of the foundation layer 20, the intermediate layer 30 and the functional unit 40 (stacked axis). An axis perpendicular to the Z axis is defined as an X axis (first axis). An axis perpendicular to the Z axis and the X axis is defined as a Y axis.

Figure 2:
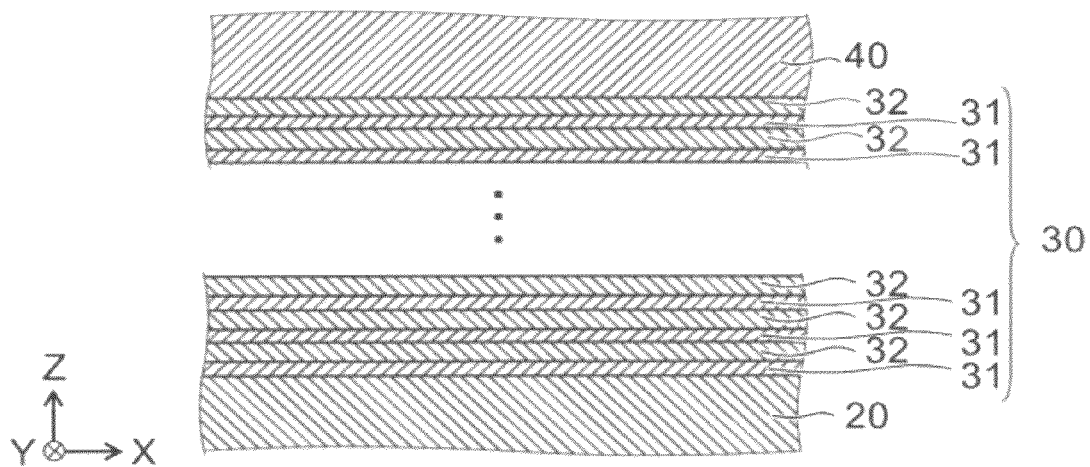
FIG. 2 is a schematic cross-sectional view showing a part of the wafer according to the first embodiment.

FIG. 2 is a schematic cross-sectional view illustrating the configuration of a part of the wafer according to the first embodiment. FIG. 2 shows an example of the configuration of the intermediate layer 30.

As shown in FIG. 2, the intermediate layer 30 includes a plurality of first layers 31, and a second layer 32 provided between the first layers 31. The first layer 31 and the second layer 32 include a nitride semiconductor. The first layer 31 and the second layer 32 are stacked alternately along the Z axis.

In a state of not being influenced by strain, the lattice spacing in the second layer 32 along a first axis (for example, X axis) perpendicular to the stacking direction (Z axis) is different from the lattice spacing in the first layer 31 along the first axis. Furthermore, the thermal expansion coefficient in the second layer 32 may be different from the thermal expansion coefficient in the first layer 31. That is, the second layer 32 may have at least one of a lattice spacing different from the lattice spacing in the first layer 31, and a thermal expansion coefficient different from the thermal expansion coefficient in the first layer 31. The thickness of the second layer 32 may be different from or may be the same as the thickness of the first layer 31.

For the first layer 31, for example, $Al_{x1}In_{y1}Ga_{z1}N$ ($0<x1\le1$, $0\le y1<1$, $0\le z1<1$) is used. The first layer 31 includes, for example, AlN. In the specification of the application, $Al_{x1}In_{y1}Ga_{z1}N$ ($0<x1\le1$, $0\le y1<1$, $0\le z1<1$) is included in AlN. For the second layer 32, for example, $Al_{x2}In_{y2}Ga_{z2}N$ ($0\le x2<1$, $0\le y2<1$, $0<z2\le1$) is used. The second layer 32 includes, for example, GaN. In the specification of the application, $Al_{x2}In_{y2}Ga_{z2}N$ ($0\le x2<1$, $0\le y2<1$, $0<z2\le1$) is included in GaN.

For example, as the first layer 31, an AlN layer having a thickness of 7.5 nm is used. As the second layer 32, a GaN layer having a thickness of 30 nm is used. While setting one first layer 31 and one second layer 32 as one period, for example, 20 periods of the first layer 31 and the second layer 32 are provided. But, the number of the period to be provided is arbitrary.

As described above, the intermediate layer 30 may have the periodic structure of the first layer 31 and the second layer 32. The structure is, for example, a superlattice structure. But, the intermediate layer 30 may have, for example, a configuration of a layer of a single body including AlN.

As shown in FIG. 1, the substrate 11 and the base layer 12 are included in the substrate part 10. When the silicon layer 13 is provided (observed), the silicon layer 13 is also included in the substrate part 10. The substrate part 10 has a configuration of SOI (silicon on insulator). The substrate 11 works as a support in handling. The base layer 12 is a buried oxide film layer.

The base layer 12 is, for example, a silicon dioxide layer. For the base layer 12, for example, a material of silicon dioxide including another element (for example, nitrogen) may be used.

The silicon layer 13 is, for example, single crystalline. The silicon layer 13 may be polycrystalline and porous. Hereinafter, a case where the silicon layer 13 is a single crystalline silicon layer having a thickness of 12 nm will be described.

The silicon layer 13 is a layer including mainly silicon. The silicon layer 13 may include a small amount of element other than silicon. For example, a part on the upper surface (surface contacting the foundation layer 20) side of the silicon layer 13 may include at least one of nitrogen and carbon. That is, the part on the upper face side of the silicon layer 13 may include at least one of SiN, SiC and $SiO_xN_y$. A region including at least one of SiN, SiC and $SiO_xN_y$ may be provided in a part in the surface of the silicon layer 13 (in the surface perpendicular to the Z axis).

The foundation layer 20 is a nitride semiconductor including mainly GaN. The thickness of the foundation layer 20 (length along the Z axis) is, for example, not less than 10 nm and not more than 5000 nm. The thickness of the foundation layer 20 is desirably not less than 50 nm and not more than 1500 nm.

The foundation layer 20 has a first region 21 and a second region 22. The first region 21 is a part on the base layer 12 side (the side opposite to the intermediate layer 30) in the foundation layer 20. The second region 22 is a part on the intermediate layer 30 side in the foundation layer 20.

The surface on the base layer 12 side (the side opposite to the intermediate layer 30) of the foundation layer 20 is referred as a first surface 20a. The surface on the intermediate layer 30 side of the foundation layer 20 is referred as a second surface 20b.

The concentration of silicon atoms in the first region 21 is higher than the concentration of silicon atoms in the second region 22. For example, the concentration of silicon atoms in the foundation layer 20 decreases along with the movement in the direction from the foundation layer 20 toward the intermediate layer 30. The concentration of silicon atoms is obtained, for example, by a secondary ion mass spectrometry (SIMS) and the like.

The foundation layer 20 has a plurality of voids 20v provided in the first region 21.

For example, there may be such case that a plurality of concave portions are provided on the first surface 20a of the foundation layer 20 and the concave portions and the base layer 12 (substrate part 10) form the voids 20v.

For example, at the first surface 20a of the foundation layer 20, silicon atoms contained in the silicon layer 13 moves from the silicon layer 13 to the foundation layer 20. As a result of a reaction between GaN and Si, the void 20v is formed. The size of the void 20v (the length along the Z axis and the length along the direction perpendicular to the Z axis) is about 300 nm or less.

In the wafer 80, there is a difference in lattice constants between the substrate part 10 and the functional unit 40. In the wafer 80 according to the embodiment, the above-mentioned configuration suppresses the defect of the crystal generated by the difference in lattice constants between the substrate part 10 and the functional unit 40. Furthermore, the stress, during the crystal growth or after the crystal growth, caused by the difference in thermal expansion coefficients of the substrate part 10 and the functional unit 40, is relaxed. Thereby, a high-quality functional unit 40 can be obtained.

In the example, the foundation layer 20 has minute gaps 20c. The minute gaps 20c extend along the Z axis. At least a part of the minute gap 20c is provided in the second region 22. That is, the minute gaps 20c are generated in a part contacting the intermediate layer 30 in the foundation layer 20.

The minute gaps 20c are generated, for example, in a process of forming at least one of the intermediate layer 30 and the functional unit 40 on the foundation layer 20. In addition, the minute gaps 20c are generated, for example, by performing a temperature-falling process after the formation of at least one of the foundation layer 20, the intermediate layer 30 and the functional unit 40. When the formation process of these layers also includes a temperature-falling process, the minute gaps 20c are generated. Due to the stress caused by the difference in thermal expansion coefficients, the minute gaps 20c may be generated in the foundation layer 20. The generation of the minute gaps 20c reduces the stress caused by the difference in thermal expansion coefficients. This can suppress, for example, the warpage and the like of the wafer 80.

As described above, in the wafer 80 according to the embodiment, by providing the controlled void 20v in the first region 21 of the foundation layer 20, it is possible to suppress the defect of the crystal caused by the difference in lattice constants and, furthermore, to reduce the stress caused by the difference in thermal expansion coefficients to thereby give a high-quality functional unit 40. Hereinafter, an experiment that was the base of finding the configuration will be described.

In the experiment, an SOI substrate (substrate part 10) was used, in which the base layer 12 (buried oxide layer) was formed on the substrate 11, and the silicon layer 13 was formed on the layer 12. The silicon layer 13 has a thickness of 12 nm.

The SOI substrate was cleaned with a mixed solution of $H_2SO_4$ and $H_2O_2$ in 1:1 for 5 min. After cleaning with pure water, an oxide film on the SOI substrate was removed with 2%-diluted HF. After cleaning with pure water, the SOI substrate was placed on the susceptor of an epitaxial growth apparatus.

First, the SOI substrate was subjected to thermal cleaning at 1000° C. for 3 min.

Next, the temperature was fallen to 520° C. and a GaN layer (initial GaN layer) to be a part of the foundation layer 20 was grown. The initial GaN layer has a thickness of about 70 nm.

Next, the susceptor temperature was raised to 1120° C. and a GaN layer (additional GaN layer) to be the rest of the foundation layer 20 was grown. The additional GaN layer has a thickness of 1030 nm. Thereby the foundation layer 20 was formed.

Successively, as the intermediate layer 30, while denoting a GaN layer (second layer 32) having a thickness of 30 nm and an AlN layer (first layer 31) having a thickness of 7.5 nm as one period, 20 periods were formed.

On the intermediate layer 30, a GaN layer to be (at least a part of) the functional unit 40 was formed. The GaN layer has a thickness of 300 nm. Thereby a sample of the wafer 80 was fabricated. Meanwhile, by forming furthermore, for example, an active layer, a doping layer, a contact layer, an electron supply layer and the like on the GaN layer, various semiconductor devices are formed.

Figure 3:
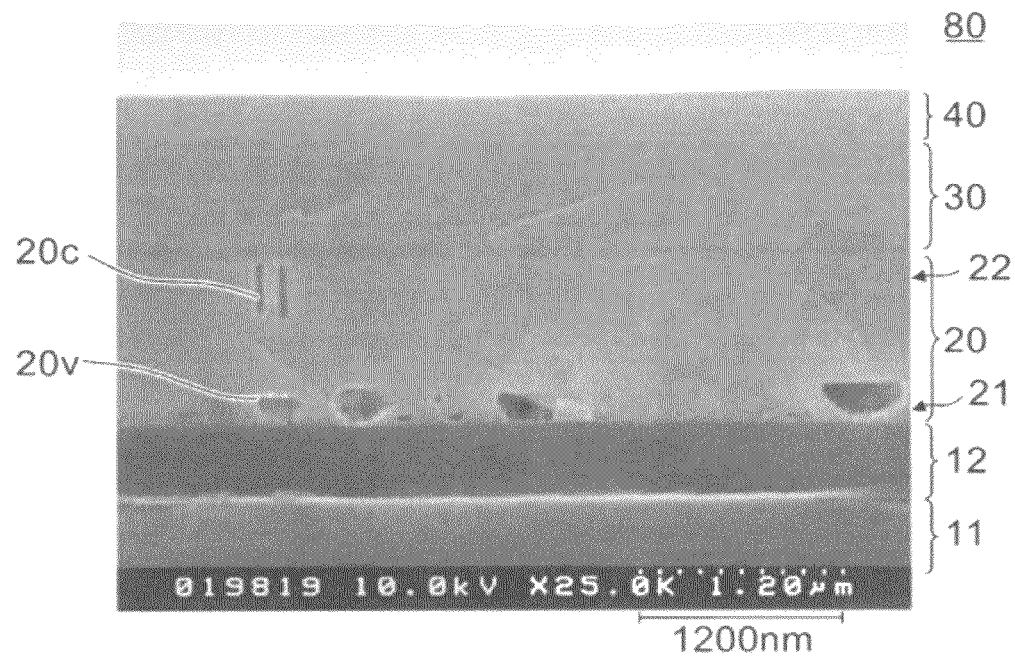
FIG. 3 is a scanning electron microscope photograph showing the wafer according to the first embodiment.

FIG. 3 is a scanning electron microscope photograph illustrating the wafer according to the first embodiment.

FIG. 3 is a scanning electron microscope photo image showing the cross-section of the sample of the wafer 80.

As shown in FIG. 3, multiple voids 20v are formed in the first region 21 in the foundation layer 20. The void 20v has a height (length along the Z axis) of about 200 nm. In the second region 22 in the foundation layer 20, the minute gaps 20c (crack) are formed. In this way, the void 20v and the minute gap 20c are formed selectively in respective specific positions (first region 21 and second region 22) in the foundation layer 20. This makes it possible to suppress the transmission of properties of the surface of the substrate part 10 to the intermediate layer 30 and the functional unit 40.

In the embodiment, the crack and the like in the functional unit 40 are reduced. And, the crystallinity of the functional unit 40 is improved. That is, the functional unit 40 has a high quality.

As described above, the configuration of the embodiment can provide a wafer having a high-quality crystal formed on a substrate such as silicon.

From an original experiment of the inventors, it has been revealed that the reaction of the initial GaN layer with Si significantly reduces the substantial generation density of nuclei in the GaN layer. That is, the reaction of the initial GaN layer with Si enlarges the substantial dimension of each nucleus in the foundation layer 20.

Furthermore, from the result of the original experiment of the inventors, it has been revealed that these nuclei of GaN first grow in a pyramid-like shape having a height of about 750 nm and, after that, GaN grows in the lateral direction to unite nuclei each other to form a flat film.

As a result that the formation process of the foundation layer 20 includes such crystal growth process, the upper surface of the foundation layer 20 becomes flat. And, the inside of the foundation layer 20 (lower side part) includes a lot of GaN grown in the lateral direction. This can reduce the dislocation from the substrate part 10 caused by the lattice mismatch.

At this time, the supply of appropriate amount of silicon atoms into the lower part (first region 21) of the foundation layer 20 makes it possible to form the voids 20v selectively in the first region 21 and to form the above-mentioned configuration (the foundation layer 20 having a flat upper surface and a laterally grown GaN layer in the inside). If a large amount of silicon atoms are supplied into the foundation layer 20, the silicon atoms are introduced into a wide region in the foundation layer 20. And, since the size of the voids 20v becomes too large, a high-quality crystal having the above-mentioned configuration cannot be obtained.

On the basis of such phenomena found by the original experiment of the inventors, the configuration of the embodiment has been established. This can provide a wafer having a high-quality crystal formed on a substrate such as silicon.

Figure 4:
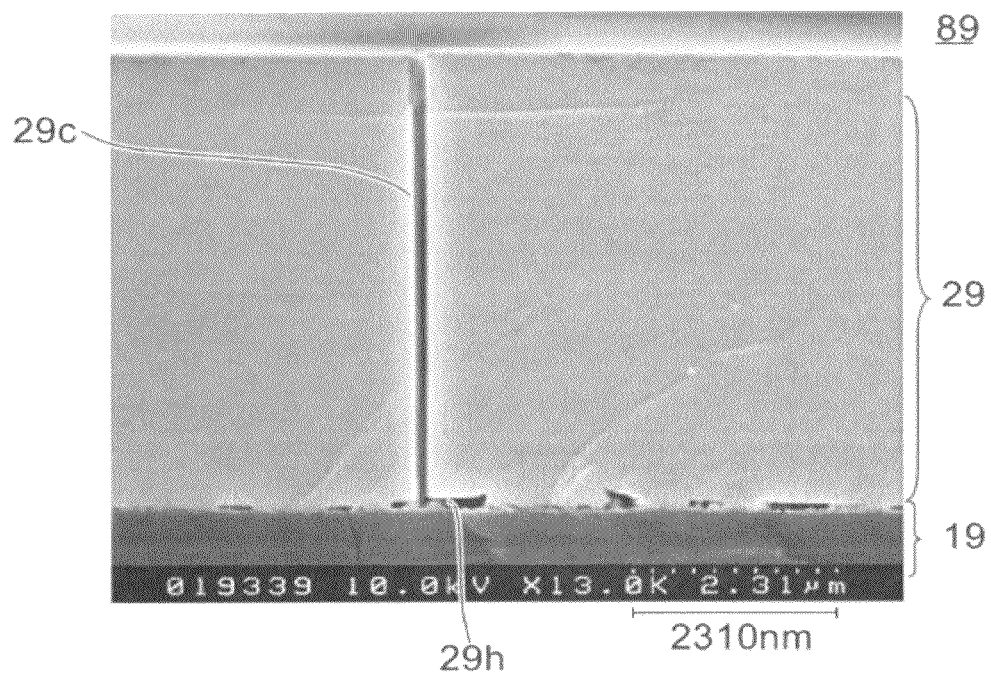
FIG. 4 is a scanning electron microscope photograph showing a wafer of a reference example.

FIG. 4 is a scanning electron microscope photograph illustrating a wafer of a reference example.

This photograph shows a state of a wafer 89, which is a first reference example. In the wafer 89 of the first reference example, an AlN lower part layer (buffer) having a thickness of 40 nm is formed on a silicon substrate 19 of a (111) plane, and, successively, a GaN layer 29 is formed.

As shown in FIG. 4, in the GaN layer 29, a large crack 29c is generated. The crack 29c penetrates through the GaN layer 29 in the thickness direction. A very large hole 29h is formed in a part on the silicon substrate 19 side of the GaN layer 29.

When an AlN buffer layer is formed on the silicon substrate 19, and, after that, a GaN layer is formed as described above, the large crack 29c or the large hole 29h is formed and the high-quality crystal cannot be obtained.

It is considered that the large hole 29h has been formed, for example, by the reaction of a silicon atom of the silicon substrate 19 with the GaN layer 29.

In order to prevent the reaction of Ga with Si when a nitride semiconductor is grown on a Si substrate, such technique is used that an AlN layer is formed on the silicon substrate 19 and, on the AlN layer, a GaN layer is formed (second reference example). But, the difference between lattice constants of AlN and Si (111) is larger than the difference between lattice constants of GaN and Si (111), and many defects tend to be generated easily. Moreover, when a GaN layer is formed on an AlN layer, new defects tend to be generated easily. The same situations occur in a case where an AlGaN layer is formed on the silicon substrate 19 and a GaN layer is formed on the AlGaN layer.

Third reference example may be considered in which a stacked film of an AlN layer and a GaN layer stacked alternately is formed on an AlN layer formed on the silicon substrate 19, for example, and a GaN layer is formed thereon. But, in this case, also, defects caused by the difference in lattice constants tend to be generated easily. Furthermore, defects caused by the lattice mismatch when the GaN layer is grown on the AlN layer also tend to be generated easily.

In addition, a fourth reference example is considered, in which a stacked film of an AlN layer and a GaN layer stacked alternately is formed on the silicon substrate 19, for example, and a GaN layer is formed thereon. In this case, also, defects caused by the lattice mismatch between Si (111) and AlN tend to be generated easily.

That is, in the first to fourth reference examples, the state (controlled void 20v, controlled nucleus of GaN, flatness of the surface due to the lateral growth of GaN) that can be generated in the particular configuration of the embodiment is not formed.

In contrast, in the embodiment, the amount of silicon atoms to be supplied to the foundation layer 20 is controlled by providing the base layer 12 on the substrate 11, and providing the extremely thin silicon layer 13 on the layer 12. That is, the amount of silicon atoms contained in the silicon layer 13 determines the maximum amount of silicon atoms contained in the foundation layer 20. This makes it possible to control, for example, the reaction amount of GaN with Si, and, as a result, the void 20v generated are formed in a controlled state.

In the foundation layer 20, silicon atoms are supplied from the first surface 20a. Consequently, the concentration of silicon atoms in the first region 21 close to the first surface 20a becomes higher than the concentration of silicon atoms in the second region 22 close to the second surface 20b. Inversely, in the case where the concentration of silicon atoms in the first region 21 is higher than the concentration of silicon atoms in the second region 22, it can be presumed that silicon atoms have been supplied from the first surface 20a. And, in the foundation layer 20, not too large voids 20v are selectively generated in the first region 21 in the controlled state. The void 20v is formed, for example, by melt back etching.

Then, by forming the additional GaN layer on the initial GaN layer including thus controlled void 20v, the nucleus of GaN is controlled, and, furthermore, the growth of GaN in the lateral direction is generated and, as a result, a flat surface is obtained. And, the dislocation caused by the lattice mismatch from the substrate part 10 is suppressed. This can give a high-quality crystal. Such particular phenomenon in the particular configuration is not known.

In the embodiment, the thickness of the foundation layer 20 and the thickness of the initial GaN layer in the foundation layer 20 are set to be a thickness that enables the generation of GaN nuclei and the thickness of forming the flat GaN layer via the growth in the lateral direction to be realized. The thickness of the foundation layer 20 is desirably not less than 50 nm and not more than 1500 nm. When it is less than 50 nm, for example, the void 20v penetrates through the foundation layer 20. When it is thicker than 1500 nm, for example, the amount of warpage becomes large to make the suppression of the generation of the crack 29c difficult. The thickness of the foundation layer 20 (the thickness of the initial GaN layer and the thickness of the additional GaN layer) may be controlled, for example, by various growth conditions including growth temperature, pressure, partial pressures of respective raw materials and the like.

By using the wafer 80 according to the embodiment, various semiconductor devices with a high performance can be manufactured. For example, the functional unit 40 of the wafer 80 can have various layers included in semiconductor devices. Furthermore, on the functional unit 40 of the wafer 80, various layers included in semiconductor devices can additionally be provided. For example, by forming a plurality of semiconductor devices on the wafer 80, and dividing the wafer 80, an individual semiconductor device is formed.

Figure 5A:
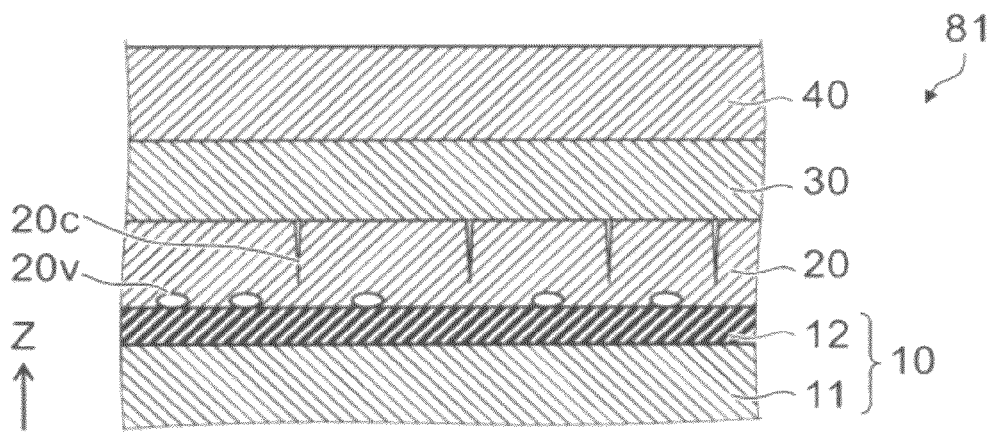
FIGS. 5A and 5B are schematic cross-sectional views showing another wafer according to the first embodiment.
Figure 5B:
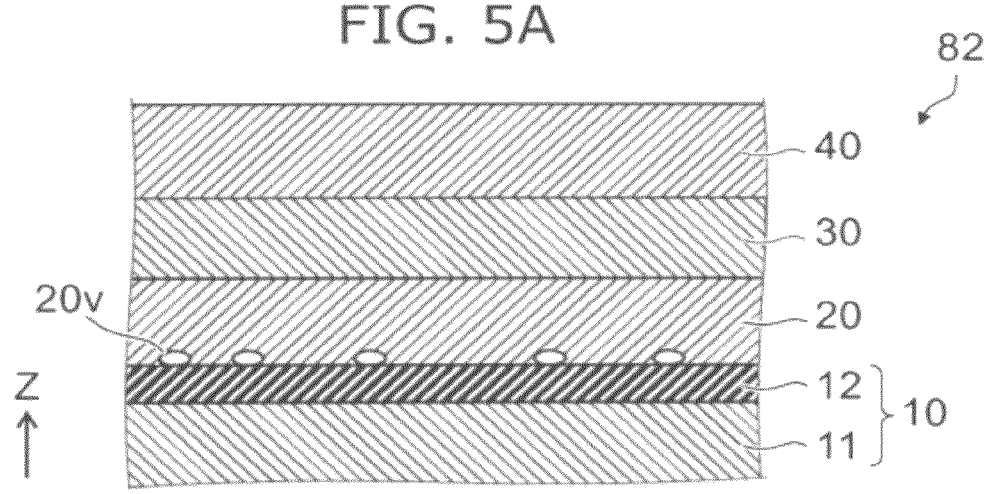

FIGS. 5A and 5B are schematic cross-sectional views illustrating the configuration of another wafer according to the first embodiment.

As shown in FIG. 5A, in a wafer 81 according to the embodiment, the silicon layer 13 is not provided. That is, in the middle of forming the wafer 80, silicon atoms of the silicon layer 13 have been supplied to the foundation layer 20, and the silicon layer 13 has disappeared.

As shown in FIG. 5B, in a wafer 82 according to the embodiment, the minute gap 20c is not provided. For example, depending on the condition of the foundation layer 20, the condition of the intermediate layer 30, and the condition of the functional unit 40, there is such case that a good functional unit 40 is obtained even if the minute gap 20c is not formed.

In the wafer 81 and the wafer 82, also, a wafer having a high-quality crystal formed on a substrate such as silicon can be provided.

In the embodiment, as the intermediate layer 30, the use of the stacked structure of the first layer 31 and the second layer 32 exemplified in FIG. 2 (for example, superlattice structure) is preferable. This can suppress the deterioration of crystal quality cased by the difference in lattice constants, the difference in thermal expansion coefficients, and the like among the substrate part 10, the foundation layer 20 and the functional unit 40. In particular, a partial crack (crack 29c and the like) of the substrate by stress can be suppressed. As described above, the use of the stacked structure for the intermediate layer 30 is furthermore preferable.

Particularly, the use of an Al-rich AlGaN layer as the first layer 31 and the use of a GaN layer thicker than the first layer 31 as the second layer 32 are preferable. For example, the use of $Al_xGa_{1-x}N$ (x>0.5) having a thickness not less than 0.5 nm and not more than 10 nm as the first layer 31 and the use of a GaN layer having a thickness not less than the thickness of the first layer 31 not more than 50 nm as the second layer 32 are preferable. The first layer 31 containing Al can increase the mechanical strength. In addition to that, the use of a GaN layer as the second layer 32 can enhance the crystal quality, and reduce the warpage.

It is also possible, after forming the wafer according to the embodiment, to remove at least one of the substrate part 10, the foundation layer 20, the intermediate layer 30, and a part of the functional unit 40 on the intermediate layer 30 side, and to use the left part (for example, at least a part of the functional unit 40).

It is also possible to move the left part to another substrate or supporting base body. It is also possible to remove the substrate part 10, to produce a device having the functional unit 40 and to use a device for which a base body is furthermore formed.

(Second Embodiment)

The embodiment relates to a crystal growth method.

Figure 6:
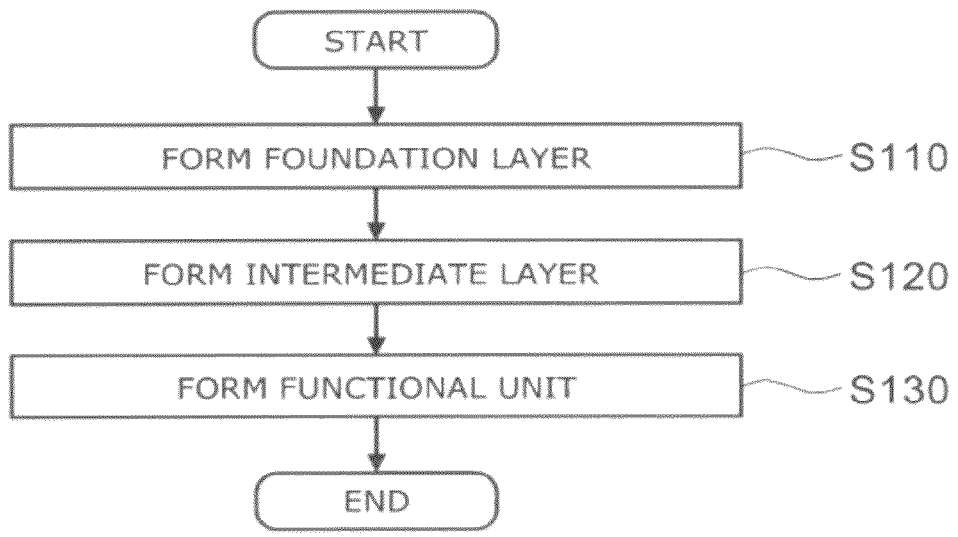
FIG. 6 is a flow chart showing a crystal growth method according to a second embodiment.

FIG. 6 is a flow chart illustrating the crystal growth method according to the second embodiment.

As shown in FIG. 6, the crystal growth method according to the embodiment includes forming the foundation layer 20 including GaN on the silicon layer 13 (Step S110). As explained already, the silicon layer 13 is provided on the base layer 12 provided on the major surface of the substrate 11. The thickness of the silicon layer 13 is not less than 1 nm and not more than 50 nm.

The crystal growth method further includes forming the intermediate layer 30 including a layer including AlN on the foundation layer 20 (Step S120).

The crystal growth method further includes forming the functional unit 40 including a nitride semiconductor on the intermediate layer 30 (Step S130).

This can form a high-quality crystal on a substrate such as silicon.

In the above-mentioned crystal growth method, the silicon layer 13 is desirably a silicon layer of a (111) plane. This tends to give easily the functional unit 40 having a high crystallinity.

As explained already, the forming the foundation layer 20 includes moving silicon atoms contained in the silicon layer 13 into the foundation layer 20. That is, it includes reducing the thickness of the silicon layer 13. Consequently, at least a part of the silicon layer 13 may disappear.

That is, the above-described forming the foundation layer 20 includes moving silicon atoms contained in the silicon layer into the foundation layer 20 to thereby increase the concentration of silicon atoms in the first region 21 on the base layer 12 side in the foundation layer 20 than the concentration of silicon atoms in the second region 22 on the opposite side to the base layer 12 in the foundation layer 20.

And, the above-described forming the foundation layer 20 includes forming a plurality of voids 20v in the first region 21 on the base layer 12 side in the foundation layer 20. As explained already, the forming the void 20v in a controlled state gives a high-quality crystal.

The above-described forming the foundation layer 20 includes forming a lower part layer (initial GaN layer) serving as a part of the foundation layer 20 and includes GaN on the silicon layer 13 at a first temperature. Further, it includes forming an upper part layer (additional GaN layer) on the lower part layer at a second temperature higher than the first temperature. The upper layer serves as another part of the foundation layer 20 and includes GaN. As explained already, the first temperature is, for example, 520° C., and the second temperature is, for example, 1120° C. In the embodiment, the first temperature is, for example, desirably not less than 450° C. and not more than 700° C. The second temperature is, for example, desirably not less than 800° C. and not more than 1200° C.

The thickness of the lower part layer (initial GaN layer) is desirably not less than 20 nm and not more than 130 nm. The thickness of the upper part layer (additional GaN layer) is desirably set so that the thickness of the foundation layer 20 is not less than 50 nm and not more than 1500 nm. The thickness of the upper part layer (additional GaN layer) is, for example, not less than 30 nm and not more than 1480 nm.

The crystal growth method may further include growing an arbitrary crystal necessary for the semiconductor device (for example, a nitride semiconductor crystal) as the functional unit 40.

In the crystal growth method, in the case where the silicon layer 13 has such thin thickness as 12 nm, when the thermal cleaning of the SOI substrate (substrate part 10) is performed under such conditions as an extremely high temperature and an excessively long time, the silicon layer 13 may agglutinate or evaporate. Therefore, with regard to the temperature, time, atmospheric gas and the like in the thermal cleaning, conditions not to exert adverse influence on the silicon layer 13 are adopted.

The temperature for forming the initial GaN layer to be the foundation layer 20 is, as described above, set to be relatively low. The temperature for forming the additional GaN layer to be formed on the initial GaN layer is set to be higher than the temperature for forming the initial GaN layer.

As explained already, the initial GaN layer reacts with the silicon layer 13 in the subsequent temperature rising process. Therefore, the initial GaN layer may disappear partially in the surface. And, at least a part of the initial GaN layer may be formed into a porous state.

The reaction amount in the initial GaN layer is controlled by the thickness of the silicon layer 13 that supplies silicon atoms to the initial GaN layer. The thickness of the initial GaN layer is, for example, preferably not smaller than the thickness of the silicon layer 13. The thickness of the initial GaN layer is furthermore preferably not less than 20 nm and not more than 130 nm. The value corresponds, for example, to the sum of the thickness of the silicon layer 13 (the thickness corresponding to the amount spent in the reaction between GaN and Si) and the thickness to be a nucleus-forming layer (for example, not less than 20 nm and not more than 80 nm).

In the crystal growth method, at least one of the process for forming the intermediate layer 30 and the process for forming the functional unit 40 after forming the foundation layer 20 may include a temperature-falling process. By this, the minute gap 20c may be generated in the foundation layer 20 by the stress caused by the difference in thermal expansion coefficients.

(Third Embodiment)

A third embodiment relates to a semiconductor device.

The semiconductor device according to the embodiment includes, for example, semiconductor light emitting devices, semiconductor light receiving devices, electronic devices and the like. The semiconductor device according to the embodiment may be produced on the basis of the wafer according to the first embodiment. At this time, the substrate part 10 of the wafer may be, for example, removed. Hereinafter, first, the configuration when the substrate part 10 of the wafer is removed will be explained.

Figure 7:
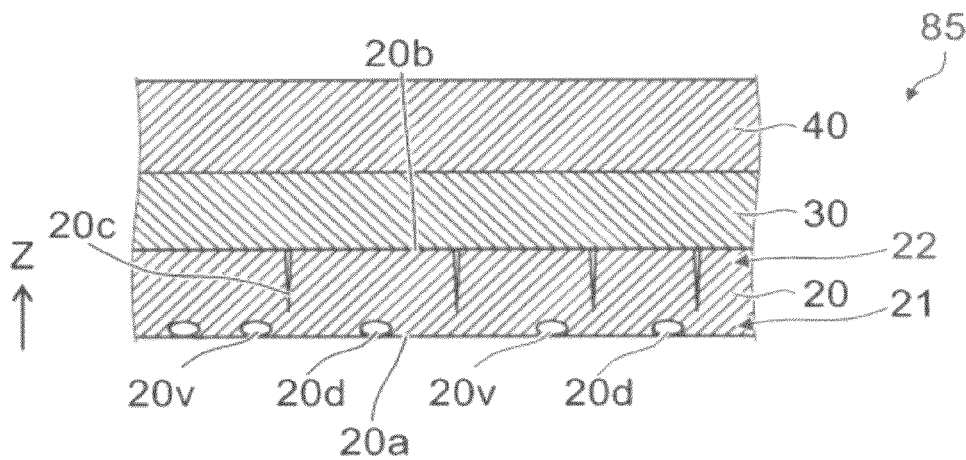
FIG. 7 is a schematic cross-sectional view showing a semiconductor device according to a third embodiment.

FIG. 7 is a schematic cross-sectional view illustrating the configuration of the semiconductor device according to the third embodiment.

As shown in FIG. 7, a semiconductor device 85 according to the embodiment includes the foundation layer 20, the functional unit 40, and the intermediate layer 30.

The foundation layer 20 includes GaN. The functional unit 40 includes a nitride semiconductor. The intermediate layer 30 is provided between the foundation layer 20 and the functional unit 40. The intermediate layer 30 includes a layer including AlN.

The concentration of silicon atoms in the first region 21 of the foundation layer 20 on the opposite side to the intermediate layer 30 is higher than the concentration of silicon atoms in the second region 22 of the foundation layer 20 on the intermediate layer 30 side. And, the first surface 20a of the foundation layer 20 on the opposite side to the intermediate layer 30 has a plurality of concave portions 20d. In the vicinity of the first surface 20a of the foundation layer 20 (for example, the first region 21), the void 20v may furthermore be provided.

The concave portion 20d is caused by the void 20v generated by the reaction between GaN and Si generating in the vicinity of the surface where the silicon layer 13 and the foundation layer 20 contact each other in the formation of the wafer according to the first embodiment. That is, when the substrate part 10 is removed from the foundation layer 20, the void 20v is exposed outside to thereby form the concave portion 20d. In other words, the concave portion 20d forms the void 20v provided between the foundation layer 20 and the base layer 12 (silicon layer 13 is also sufficient).

The semiconductor device 85 having such configuration has a high-quality crystal (for example, the functional unit 40) formed on a substrate such as silicon. This gives the semiconductor device having high properties.

In the semiconductor device 85, the thickness of the foundation layer 20 is preferably not less than 50 nm and not more than 1500 nm.

As shown in FIG. 7, in the semiconductor device 85, the foundation layer 20 may have the minute gap 20c extending along the stacked axis that penetrates along the direction from the foundation layer 20 to the functional unit 40. At least a part of the minute gap 20c is provided in the second region 22.

The intermediate layer 30 may include the stacked structure illustrated in FIG. 2. That is, the intermediate layer 30 may include a plurality of first layers 31 including a nitride semiconductor and a second layer 32 provided between the first layers 31 and including a nitride semiconductor. The second layer 32 may have at least one of a lattice spacing different from the lattice spacing in the first layer 31, and a thermal expansion coefficient different from the thermal expansion coefficient in the first layer 31.

The semiconductor device according to the embodiment may further include the substrate part 10. The substrate part 10 may include the substrate used for the crystal growth in producing the semiconductor device.

Figure 8A:
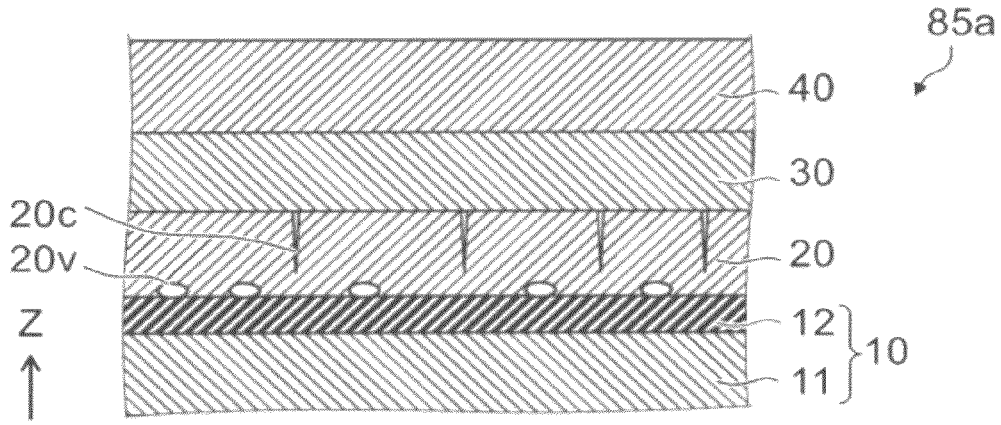
FIGS. 8A and 8B are schematic cross-sectional views showing another semiconductor device according to the third embodiment.
Figure 8B:
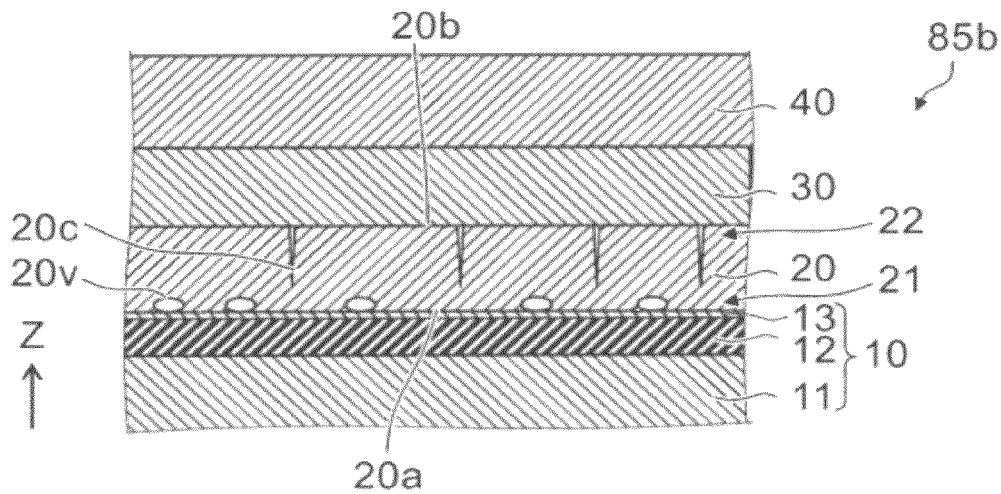

FIGS. 8A and 8B are schematic cross-sectional views illustrating the configuration of another semiconductor device according to the third embodiment.

As shown in FIG. 8A, another semiconductor device 85a according to the embodiment further includes the base layer 12. This configuration corresponds to a case where phenomenon of at least one of the move of silicon atoms of the silicon layer 13 provided on the base layer 12 into the foundation layer 20 and the move of GaN into the silicon layer 13 occurs in the production of the semiconductor device 85b, and the silicon layer 13 has disappeared.

As shown in FIG. 8B, another semiconductor device 85b according to the embodiment further includes the base layer 12 and the silicon layer 13. The silicon layer 13 contacts the base layer 12 and the foundation layer 20. The base layer 12 has a thickness not less than 1 nm and less than 10 μm. As explained already, the silicon layer 13 is a layer after the supply of an appropriate amount of silicon atoms to the foundation layer 20. The silicon layer 13 may have remained partially and disappeared partially in the plane perpendicular to the Z axis. The silicon layer 13 has, for example, a (111) plane.

In the semiconductor devices 85a and 85b, also, semiconductor devices having high properties may be obtained, by having a high-quality crystal (for example, the functional unit 40) formed on a substrate such as silicon.

Figure 9A:
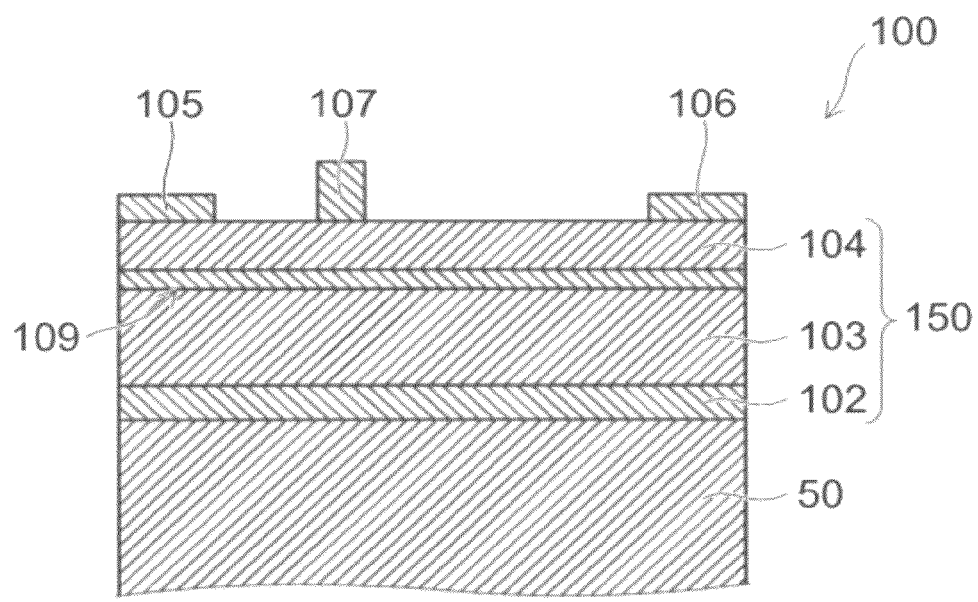
FIGS. 9A and 9B are schematic cross-sectional views showing the semiconductor device according to the third embodiment.
Figure 9B:
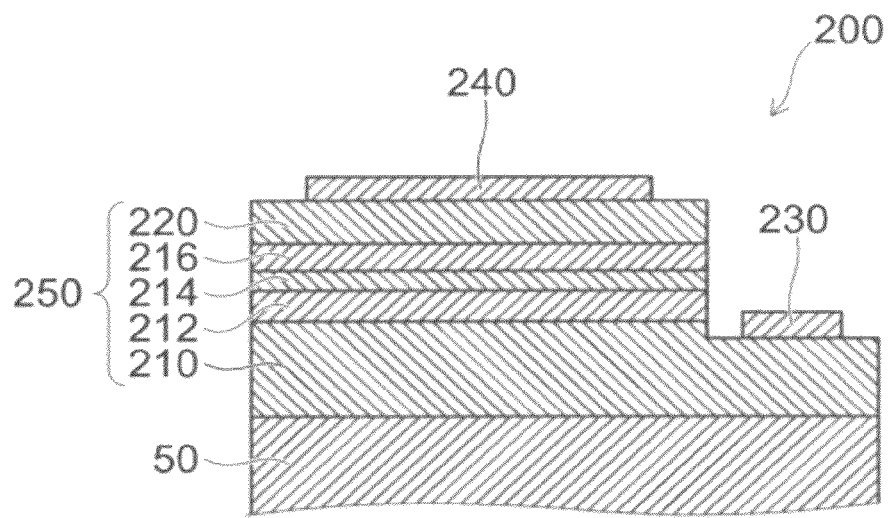

FIGS. 9A and 9B are schematic cross-sectional views illustrating the configuration of the semiconductor device according to the third embodiment.

As exemplified in FIG. 9A, a semiconductor device 100 according to the embodiment is a gallium nitride (GaN)-based HEMT (High Electron Mobility Transistor). In the semiconductor device 100, a semiconductor stacked body 150 is provided on a semiconductor layer 50. For example, the semiconductor layer 50 corresponds to the functional unit 40. Or, it may be assumed that the stacked body of the semiconductor layer 50 and the semiconductor stacked body 150 corresponds to the functional unit 40.

The semiconductor stacked body 150 includes a buffer layer 102 provided on the semiconductor layer 50, a first semiconductor layer 103 provided on the buffer layer 102, and a second semiconductor layer 104 provided on the first semiconductor layer 103. The band gap energy of the second semiconductor layer 104 is greater than the band gap energy of the first semiconductor layer 103.

The first semiconductor layer 103 is a channel layer. The second semiconductor layer 104 is a barrier layer. The first semiconductor layer 103 and the second semiconductor layer 104 is in a heterojunction state. The buffer layer 102, the first semiconductor layer 103 and the second semiconductor layer 104 are grown epitaxially in this order on the semiconductor layer 50.

The first semiconductor layer 103 includes, for example, impurity-free undoped $Al_\alpha Ga_{1-\alpha}N$ ($0 \le \alpha \le 1$). The second semiconductor layer 104 includes, for example, undoped or n-type $Al_\beta Ga_{1-\beta}N$ ($0 \le \beta \le 1$, $\alpha < \beta$). For example, as the first semiconductor layer 103, an undoped GaN layer is used, and, as the second semiconductor layer 104, an undoped or n-type AlGaN layer is used. As the buffer layer 102, for example, an AlN layer or an AlGaN layer is used. The buffer layer 102 is provided if necessary, and may be omitted depending on circumstances.

On the second semiconductor layer 104, a source electrode 105 and a drain electrode 106 are provided in a state separated from each other. Each of the source electrode 105 and the drain electrode 106 are in the state of ohmic contact with the surface of the second semiconductor layer 104. On the second semiconductor layer 104 in the part between the source electrode 105 and the drain electrode 106, a gate electrode 107 is provided. The gate electrode 107 is in a state of Schottky contact with the surface of the second semiconductor layer 104.

The lattice constant of the second semiconductor layer 104 is smaller than the lattice constant of the first semiconductor layer 103. This generates strain in the second semiconductor layer 104, and, due to the piezoelectric effect, piezoelectric polarization is generated in the second semiconductor layer 104. This forms a two-dimensional electron gas 109 in the first semiconductor layer 103 in the vicinity of the interface with the second semiconductor layer 104. In the semiconductor device 100, the control of the gate voltage applied to the gate electrode 107 causes the increase or decrease in the concentration of the two-dimensional electron gas under the gate electrode 107 to thereby control the current flowing between the source electrode 105 and the drain electrode 106.

As exemplified in FIG. 9B, a semiconductor device 200 according to the embodiment is a gallium nitride-based LED (Light Emitting Diode). In the semiconductor device 200, a semiconductor stacked body 250 is provided on the semiconductor layer 50. For example, the semiconductor layer 50 corresponds to the functional unit 40. It may also be considered that the stacked body of the semiconductor layer 50 and the semiconductor stacked body 250 corresponds to the functional unit 40.

For example, the semiconductor device 200 includes an n-type GaN layer 210 provided on the semiconductor layer 50, an n-type GaN guide layer 212 provided on the n-type GaN layer 210, an active layer 214 provided on the n-type GaN guide layer 212, a p-type GaN guide layer 216 provided on the active layer 214, and a p-type GaN layer 220 provided on the p-type GaN guide layer 216. The active layer 214 includes InGaN. The active layer 214 may have, for example, an MQW (Multi-Quantum Well) structure, in which an $In_{0.15}Ga_{0.85}N$ layer and an $In_{0.02}Ga_{0.98}N$ layer are stuck alternately. In this example, the n-type GaN guide layer 212 and the p-type GaN guide layer 216 are provided if necessary, and may be omitted depending on circumstances.

In the semiconductor device 200, the p-type GaN guide layer 216 faces a part of the n-type GaN layer 210. On another part of the n-type GaN layer 210, an n-side electrode 230 is provided. On the p-type GaN layer 220, a p-side electrode 240 is provided.

When a voltage is applied between the n-side electrode 230 and the p-side electrode 240, holes and electrons recombine and, for example, blue light is emitted from the active layer 214. The light emitted from the active layer 214 is taken out from at least one of the side of the semiconductor layer 50, the side of the p-side electrode 240, and the side of a side surface parallel to the stacking direction.

In the embodiment, for the growth of the semiconductor layer, for example, metal-organic chemical vapor deposition (MOCVD), metal-organic vapor phase epitaxy (MOVPE), molecular beam epitaxy (MBE), halide vapor phase epitaxy (HVPE), and the like can be employed.

When the MOCVD or the MOVPE is used, for example, as raw materials in forming respective semiconductor layers, the following may be employed. As the raw material of Ga, for example, TMGa (trimethylgallium) and TEGa (triethylgallium) may be employed. As the raw material of In, for example, TMIn (trimethylindium) and TEIn (triethylindium) and the like may be employed. As the raw material of Al, for example, TMAl (trimethylaluminum) and the like may be employed. As the raw material of N, for example, $NH_3$ (ammonia), MMHy (monomethylhydrazine), DMHy (dimethyihydrazine) and the like may be employed.

According to the embodiments, a wafer having a high-quality crystal formed on a substrate such as silicon, a crystal growth method and a semiconductor device are provided.

In the specification, "nitride semiconductor" includes all compositions of semiconductors of the chemical formula $B_xIn_yAl_zGa_{1-x-y-z}N$ ($0 \le x \le 1$, $0 \le y \le 1$, $0 \le z \le 1$, and $x+y+z \le 1$) for which each of the compositional proportions x, y, and z are changed within the ranges. "Nitride semiconductor" further includes group V elements other than N (nitrogen) in the chemical formula recited above, various elements added to control various properties such as the conductivity type, etc., and various elements included unintentionally.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the invention is not limited to these specific examples. For example, one skilled in the art may similarly practice the invention by appropriately selecting specific configurations of components included in wafers such as substrate parts, substrates, base layers, silicon layers, foundation layers, intermediate layers and functional units from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all wafers, crystal growth methods and semiconductor devices practicable by an appropriate design modification by one skilled in the art based on the wafer, the crystal growth method and the semiconductor device described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A wafer comprising:
   a substrate having a flat major surface;
   a base layer provided on the major surface and including a silicon compound;
   a foundation layer provided on the base layer and including GaN;
   an intermediate layer provided on the foundation layer and including a layer including AlN; and
   a functional unit provided on the intermediate layer and including a nitride semiconductor,
   the foundation layer including a first region, and a second region provided between the first region and the intermediate layer,
   a concentration of silicon atoms in the first region being higher than a concentration of silicon atoms in the second region, and
   the foundation layer having a plurality of voids provided in the first region.

2. The wafer according to claim 1, further comprising a third region provided between the base layer and the foundation layer, the third region contacting the foundation layer, the third region including silicon and having a thickness not less than 1 nanometer and not more than 50 nanometers.

3. The wafer according to claim 1, wherein a thickness of the foundation layer is not less than 50 nanometers and not more than 1500 nanometers.

4. The wafer according to claim 1, wherein the foundation layer has a minute gap extending along a stacked axis in a direction from the foundation layer toward the functional unit.

5. The wafer according to claim 4, wherein at least a part of the minute gap is provided in the second region.

6. The wafer according to claim 1, wherein
the intermediate layer includes a plurality of first layers including a nitride semiconductor, and a second layer provided between the first layers and including a nitride semiconductor, and
the second layer has at least one of a lattice spacing different from a lattice spacing in the first layer, and a thermal expansion coefficient different from a thermal expansion coefficient in the first layer.

7. The wafer according to claim 1, wherein the intermediate layer includes a plurality of first layers including AlN, and a second layer provided between the first layers and including GaN.

8. A semiconductor device, comprising:
a foundation layer including GaN;
a functional unit including a nitride semiconductor;
an intermediate layer provided between the foundation layer and the functional unit and including a layer including AlN;
a base layer including a silicon compound, the foundation layer being disposed between the base layer and the intermediate layer, the base layer being flat;
the foundation layer having a first region and a second region provided between the first region and the intermediate layer,
a concentration of silicon atoms in the first region being higher than a concentration of silicon atoms in the second region, and
a first surface on a side opposite to the intermediate layer of the foundation layer having a plurality of concave portions.

9. The device according to claim 8, further comprising a base layer contacting the first surface and including a silicon compound.

10. The device according to claim 8, further comprising:
a third region provided between the base layer and the foundation layer, the third region contacting the foundation layer, the third region including silicon and having a thickness not less than 1 nanometer and not more than 50 nanometers.

11. The device according to claim 8, wherein
the intermediate layer includes a plurality of first layer including a nitride semiconductor, and a second layer provided between the first layers and including a nitride semiconductor, and
the second layer has at least one of a lattice spacing different from a lattice spacing in the first layer, and a thermal expansion coefficient different from a thermal expansion coefficient in the first layer.

12. The device according to claim 9, wherein the concave portions form a void provided between the foundation layer and the base layer.

13. The device according to claim 8, wherein a thickness of the foundation layer is not less than 50 nanometers and not more than 1500 nanometers.

14. The wafer according to claim 2, wherein the silicon layer has a (111) plane.

15. The wafer according to claim 2, wherein the silicon layer has a portion oriented in a direction of the (111) plane.

16. The wafer according to claim 4, wherein the foundation layer includes a plurality of voids.

17. The device according to claim 10, wherein the silicon layer has a (111) plane.

18. The device according to claim 10, wherein the silicon layer has a portion oriented in a direction of the (111) plane.

19. The device according to claim 9, further comprising a substrate having a major surface, wherein the base layer is provided on the major surface, and the foundation layer is provided on the base layer.

20. The device according to claim 8, wherein the foundation layer includes a minute gap extending along a stacked axis in a direction from the foundation layer toward the functional unit.

21. The device according to claim 20, wherein at least a part of the minute gap is provided in the second region.

22. A wafer comprising:
a substrate having a major surface;
a base layer provided on the major surface and including a silicon compound;
a foundation layer provided on the base layer and including GaN, the foundation layer including a first region and a second region;
an intermediate layer provided on the foundation layer and including a layer including AlN;
a functional unit provided on the intermediate layer and including a nitride semiconductor; and
a third region provided between the base layer and the foundation layer, the third region contacting the foundation layer, the third region including silicon and having a thickness not less than 1 nanometer and not more than 50 nanometers,
the second region provided between the first region and the intermediate layer,
a concentration of silicon atoms in the first region being higher than a concentration of silicon atoms in the second region, and
the foundation layer having a plurality of voids provided in the first region.

23. A semiconductor device, comprising:
a foundation layer including GaN, the foundation layer including a first region and a second region;
a functional unit including a nitride semiconductor;
an intermediate layer provided between the foundation layer and the functional unit and including a layer including AlN;
a base layer including a silicon compound, the foundation layer being disposed between the base layer and the intermediate layer; and
a third region provided between the base layer and the foundation layer, the third region contacting the base layer and the foundation layer, the third region including silicon and having a thickness not less than 1 nanometer and not more than 50 nanometers,
the second region provided between the first region and the intermediate layer,
a concentration of silicon atoms in the first region being higher than a concentration of silicon atoms in the second region, and a first surface on a side opposite to the intermediate layer of the foundation layer having a plurality of concave portions.

\* \* \* \* \*